United States Patent
Kumagai et al.

(10) Patent No.: US 8,356,961 B2
(45) Date of Patent: Jan. 22, 2013

(54) MACHINING APPARATUS AND MACHINING METHOD

(75) Inventors: Norishige Kumagai, Ebina (JP); Tamio Otani, Ebina (JP); Katsuhiro Nagasawa, Ebina (JP); Jun Wakamatsu, Ebina (JP); Hiroyuki Kamata, Ebina (JP); Tomoaki Ozaki, Ebina (JP)

(73) Assignee: Hitachi Via Mechanics Ltd., Kanagawa (JP)

( * ) Notice: Subject to any disclaimer, the term of this patent is extended or adjusted under 35 U.S.C. 154(b) by 702 days.

(21) Appl. No.: 12/590,198

(22) Filed: Nov. 4, 2009

(65) Prior Publication Data

US 2010/0119317 A1    May 13, 2010

(30) Foreign Application Priority Data

Nov. 5, 2008  (JP) ................................. 2008-284648
Sep. 1, 2009  (JP) ................................. 2009-202064

(51) Int. Cl.
*B23B 41/00* (2006.01)
(52) U.S. Cl. ............... 408/91; 408/1 R; 408/53; 408/88; 408/234
(58) Field of Classification Search ............ 408/87, 408/88, 91, 1 R, 53, 46, 95, 234
See application file for complete search history.

(56) References Cited

U.S. PATENT DOCUMENTS

| 5,205,805 A | * | 4/1993 | Otani et al. ................. 483/9 |
| 6,547,499 B2 | * | 4/2003 | Yen et al. ................. 409/235 |
| 2002/0146294 A1 | | 10/2002 | Martinez | |

FOREIGN PATENT DOCUMENTS

| JP | 04082629 A | * | 3/1992 |
| JP | 04354196 A | * | 12/1992 |
| JP | 09150381 A | * | 6/1997 |
| JP | 2002-050848 | | 2/2002 |

* cited by examiner

*Primary Examiner* — Daniel Howell
*Assistant Examiner* — Paul M Janeski
(74) *Attorney, Agent, or Firm* — Jordan and Hamburg LLP

(57) ABSTRACT

The invention provides a machining apparatus, and its machining method, having machining tables whose weight do not increase so much even if a number of machining sections such as spindles is increased. One of the machining tables is a rectangular stationary table having a groove in the direction perpendicular to the longitudinal direction on its surface and the other is a rectangular movable table engaged with the groove. The machining apparatus machines a printed circuit board, whose area is larger than that of the movable table, on a mounting surface of the stationary table by changing position of the printed circuit board by moving the movable table and by determining machining position by moving a spindle at position facing the mounting surface of the stationary table.

13 Claims, 17 Drawing Sheets

FIG.14A
FIG.14B
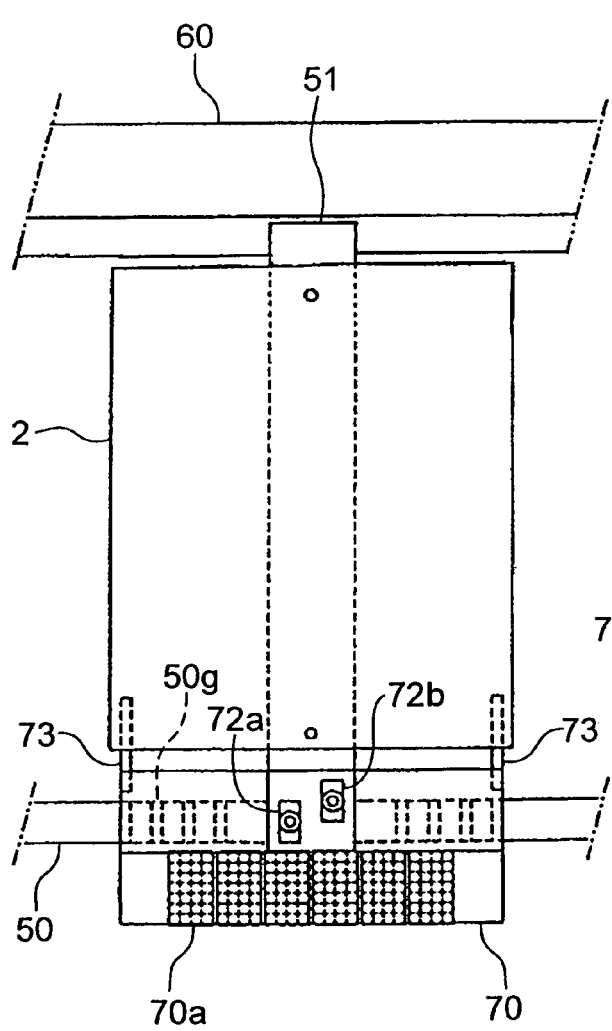
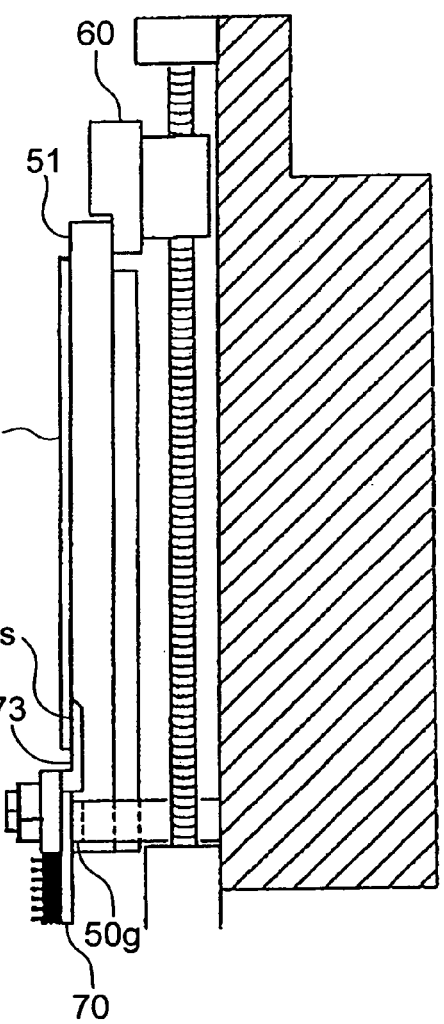

MACHINING APPARATUS AND MACHINING METHOD

CROSS REFERENCES TO RELATED APPLICATIONS

This application claims a priority to Japanese patent application Nos. 2008-284648 filed on Nov. 5, 2008 and 2009-202064 filed on Sep. 1, 2009, the entire content of which is hereby incorporated herein by reference.

BACKGROUND ART

1. Field of the Invention

The present invention relates to a machining apparatus for machining work pieces and a machining method thereof.

2. Description of the Related Art

FIG. 19 is a perspective view of a prior art printed circuit board drilling apparatus that is one of machining apparatuses, FIG. 20 is a front view showing a section near a spindle of the prior art printed circuit board drilling apparatus in FIG. 19 and FIG. 21 is a plan view of a table of the printed circuit board drilling apparatus in FIG. 19.

In FIG. 19, a table 1 of the printed circuit board drilling apparatus is supported by a guide not shown and is movable in an X-axis direction on a bed 20. A cross rail 21 is fixed to the bed 20 so as to straddle over the table 1. The cross rail 21 is provided with guides 23 on a front face thereof. The guides 23 support a cross slide 22 that is movable in a Y-axis direction along the guides 23 by a motor 24. The cross slide 22 is provided with guides 31 for supporting bases 30 on a front face thereof. The guide 31 is movable in a Z-axis direction by a motor 32. Each base 30 is provided with a saddle 33 fixed at a front face thereof and the saddle 33 is provided with a spindle 40 fixed therein.

As shown in FIG. 20, a drill 41 is held rotatably at the lower edge of the spindle 40. The spindle 40 also supports a pressure foot 42 fitted closely to the lower portion thereof in the Z-axis direction and pressed downward in the figure by an air cylinder not shown.

Printed circuit boards 2a to be worked, i.e., work pieces, are mounted in stacks on a surface 1a of the table 1 while each stack is laid upon a backing plate 2b and fixed together by two reference pins 3. The printed circuit boards 2a to be worked and the backing plate 2b will be referred to as a whole as a printed circuit board 2 hereinafter. It is noted that a phenol resin of 1 to 2 mm thick is often used for the backing plate 2b.

As shown in FIG. 21, holes (shown as cutouts in the FIGS. 4 and 5 are formed in the table 1. A rectangular first clamp plate 7 is disposed in the hole 4 in which a V-shaped groove 6 is formed on the opposite side of the hole. While the length of the clamp plate 7 in the X-axis direction is substantially equal to the length of the side of the hole 4 in the X-axis direction, the length of the clamp plate 7 in the Y-axis direction is shorter than the surface-to-surface distance between the cylindrical surface of the first reference pin 3a contacting with the groove 6 on the side, in which the clamp plate 7 is disposed, and the surface 4b facing the groove 6 (the right-side surface of the hole 4 in the figure).

A rectangular second clamp plate 8 is disposed in the rectangular hole 5. While the length of the clamp plate 8 in the X-axis direction is substantially equal to the length of the side of the hole 5 in the X-axis direction, the length of the clamp plate 8 in the Y-axis direction is shorter than the distance obtained by subtracting the diameter of the second reference pin 3b from the length of the side of the hole 5 in the Y-axis direction. It is noted that the diameter of the first reference pin 3a is equal with that of the second reference pin 3b. Each of the clamp plates 7 and 8 is supported by a linear guiding unit 9 disposed at each bottom of the holes 4 and 5, which is composed of a bearing 9a and a track 9b so that respective upper surfaces of the clamp plates are leveled with the surface 1a of the table 1 as shown in FIG. 20 and are movable in the Y-axis direction by a driving means not shown.

Next, a machining procedure of the prior art printed circuit board drilling apparatus 100 will be explained.

Firstly, distances between the left-side surface 7a of the clamp plate 7 and the groove 6 and between the left-side surface 8a of the clamp plate 8 and the right inner-side surface 5a of the hole 5 are maximized by abutting right-side surfaces 7b and 8b of the clamp plates 7 and 8 against inner-side surfaces 4b and 5b of the holes 4 and 5 as shown by solid lines in FIG. 21. Next, after mounting the printed circuit board 2 on the table 1, the clamp plates 7 and 8 are moved left in the figure to abut the first reference pin 3a against the groove 6 by the left-side surface 7a of the clamp plate 7 and the second reference pin 3b against the left inner-side surface 5a by the left-side surface 8a. Then, the printed circuit board 2 is positioned in the Y-axis direction as a line O connecting centers of the two reference pins 3a and 3b becomes parallel with the X-axis and also in the X-axis direction by the groove 6.

The table 1 is moved in the X-axis direction while holding the printed circuit board 2 and the cross slide 22 is moved in the Y-axis direction in the above described manner to position the drill 41 above a machining section of the printed circuit board 2 (to determine machining position of the work piece). Then, the base 30 is moved in the Z-axis direction and the drill 41 is cut into the printed circuit board 2 while pressing the printed circuit board 2 by the pressure foot 42 to drill the printed circuit board 2.

The drilling apparatus 100 in the figure has four spindles 40, so that it can machine by four times of speed as compared to a printed circuit board drilling apparatus having one spindle 40 for example.

Although it is possible to improve machining efficiency by increasing a number of spindles, it requires a table having a large surface area. Furthermore, it is necessary to increase thickness of the table along the increase of the surface area of the table in order to keep rigidity of the table, thus increasing weight of the table. Then, Japanese Patent Application Laid-open No. 2002-050848 has proposed a printed circuit board drilling apparatus whose table weight is lightened by making the table, that is normally made of steel, of glass-fiber reinforced resin laminate.

Lately, it has become more and more important to downsize a driving source by lightening the machining table that is moved while mounting work pieces and to be able to position the work pieces quickly and accurately in order to increase efficiency, to save energy and to conduct fine-machining of the machining apparatus or the printed circuit board drilling apparatus described above in particular.

Though it is possible to lighten the weight of the machining table, as compared to a table made of steel, by using the material whose specific gravity is light, such as the glass-fiber reinforced resin laminate described above, it is unable to reduce the size of the table that moves during machining by a conventional arrangement that moves the whole machining table even if the table is lightened by using such material whose specific gravity is light. That is, this arrangement has been a drawback in lightening the table further.

There has been also a problem that the more the number of machining sections such as the spindles is increased, the more the area and thickness of the machining table increase, thus the weight increase rate of the table, that is moved during machining, is increased drastically.

SUMMARY OF THE INVENTION

Accordingly, the invention aims at solving the aforementioned problems by providing a machining apparatus, and a machining method thereof, that is arranged so that the weight increasing rate of the table that moves during machining is minimized even if a number of machining sections such as spindles is increased.

According to a first aspect of the invention, there is provided a machining apparatus having:
  machining tables having mounting surfaces for mounting a work piece and
  a machining section for machining the work piece mounted on the mounting surfaces of the machining tables,
  the machining tables and machining section being relatively moved in plan view to determine machining position and to machine the work piece;
  wherein one of the machining tables is a stationary table located at position facing to the machining section, having a length at least longer than a moving distance of the machining section and fixed to a stationary member; and
  the other is a movable table movably supported in the (horizontal) direction perpendicular to the moving direction of the machining section with respect to the stationary table and having the mounting surface whose width is narrower than the work piece to be mounted in the moving direction of the machining section; and
  wherein the work piece is fixed on the mounting surface of the movable table, moved by the movable table in the direction perpendicular to the moving direction of the machining section, and machined by the machining section at positions on the mounting surface of the stationary table where the machining section is relatively moved above.

So far, it had been not considered to use the movable table whose width is narrower than the width of the work piece because the work piece might sag or slide with friction on the stationary table. However, the inventors have found that these disadvantages exerting influence on machining may be mostly overcome by arranging the machining apparatus as described above and that these disadvantages may be reduced further by elaborating the machining apparatus variously as described below.

According to a second aspect of the invention, preferably the stationary and movable tables are arranged so as to support part of the work piece by the mounting surfaces of the stationary and movable tables and to support the center of gravity of the work piece by the mounting surface of the movable table.

According to a third aspect of the invention, preferably the stationary table is formed into a rectangular shape that is long in the direction (Y-axis direction) in which the machining section moves in plan view and has a groove cut in the direction (X-axis direction) perpendicular to the longitudinal direction (Y-axis direction) on the mounting surface thereof;
  the movable table is slidably supported by the groove of the stationary table and is formed into a rectangular shape whose length in a direction along the groove is at least longer than the length of the groove;
  the machining tables are constructed by crossing these rectangular stationary and movable tables; and
  the machining tables do not support the whole area of the work piece and are arranged so as to machine the work piece on the mounting surface of the stationary table or on the mounting surface of the movable table at the crossing with the stationary table.

According to a fourth aspect of the invention, preferably a machining unit is composed of a plurality of machining sections disposed in parallel at predetermined regular intervals, one stationary table, and
  a plurality of movable tables provided in parallel at positions corresponding to the respective machining sections;
  wherein the machining apparatus includes at least one machining unit.

According to a fifth aspect of the invention, preferably the difference of level of the mounting surfaces of the stationary and movable tables is set within a range in which the work piece can be retained with its flexibility on the mounting surface of the stationary table when the machining section presses the work piece to the stationary table during machining.

According to a sixth aspect of the invention, the movable table may be arranged so that the level (J) of the mounting surface of the movable table is higher than the level (K) of the mounting surface of the stationary table (J>K).

According to a seventh aspect of the invention, the movable table may be also arranged so that the level of the mounting surface of the movable table is lower than that of the mounting surface of the stationary table (J<K).

According to an eighth aspect of the invention, when the work piece is a printed circuit board, preferably the difference in level between the mounting surface of the stationary table and the mounting surface of the movable table is within a range of ±0.1 mm.

According to a ninth aspect of the invention, a frame member extending in the moving direction (Y-axis direction) of the machining section is provided at one end of the movable table, a support for supporting an edge of the work piece is attached to the frame member, and a groove for preventing a collision with the support is formed on the stationary table at the position corresponding to the support.

According to a tenth aspect of the invention, preferably, the frame member is arranged as a tool mounting section for mounting tools of the machining section.

According to an eleventh aspect of the invention, preferably, a wear-resistant treatment is implemented on the surface of the stationary table.

According to a twelfth aspect of the invention, the machining table may be made of iron or light metal.

According to a thirteenth aspect of the invention, preferably a moving range of the movable table during machining is set within a range in which part of the work piece always overlaps with the mounting surface of the stationary table.

It is noted that the summary of the invention described above does not necessarily describe all necessary features of the invention. The invention may also be a sub-combination of the features described above.

According to the first aspect of the invention, position of the work piece on the stationary table may be changed by moving the movable table whose width is narrower than that of the work piece in the moving direction of the machining section, so that the weight of the table for moving in changing the position of the work piece may be lightened. Specifically, this arrangement allows only the movable table to be moved in moving the work piece, even if the number of machining sections is increased to increase the number of work pieces to be worked, the increase of weight of the table to be moved is only the weight of the increased movable tables, so that the rate of the weight of the table per work piece to be moved may be reduced. Therefore, if a driving unit having the same power is used, this arrangement permits to improve machining speed and machining accuracy because inertia of the table is reduced and the table may be controlled easily. Furthermore, because the stationary table is longer than the moving length of the machining section and the machining section moves above the stationary table, it is possible to machine the work piece supported firmly by the stationary table.

According to the second aspect of the invention, the stationary and movable tables are arranged so as not to support the whole area of the work piece, so that frictional resistance between the mounting surface of the stationary table and the work piece may be reduced. Furthermore, it is possible to support and move the work piece firmly even by the movable table, whose width is narrower than the work piece in the moving direction of the machining section, by supporting the center of gravity of the work piece by the mounting surface of the movable table.

According to the third aspect of the invention, the movable table may be formed light, so that the length of the stationary table supporting the movable table and that of the stationary member fixing the stationary table in the direction in which the movable table moves may be shortened and thereby, the weight of the whole machining apparatus may be remarkably reduced.

According to the fourth aspect of the invention, one machining unit is composed of the plurality of machining sections, one stationary table and the plurality of movable tables provided at positions corresponding to the respective machining sections, so that positions of many work pieces may be changed at once, thus enabling to machine the work pieces efficiently.

According to the fifth aspect of the invention, it becomes possible to firmly retain the work piece on the mounting surface of the stationary table and to accurately machine the work piece without damage by setting the difference of level of the mounting surfaces of the stationary and movable tables within the range absorbable with the flexibility of the work piece.

According to the sixth aspect of the invention, it is possible to reduce a contact area between the work piece and the stationary table, to reduce frictional resistance when the work piece moves and to reduce wear of the mounting surface of the stationary table by increasing the level of the mounting surface of the movable table more than the level of the mounting surface of the stationary table.

According to the seventh aspect of the invention, it is possible to reduce vertical movement of the work piece during machining by lowering the level of the mounting surface of the movable table than the level of the mounting surface of the stationary table, which reduces wear of holes for fitting positioning pins of a fixing section of the work piece, for example.

According to the eighth aspect of the invention, it is possible to firmly hold the work piece on the mounting surface of the stationary table and to machine without damage even if the work piece is a printed circuit board by setting the difference in level between the mounting surface of the stationary table and the mounting surface of the movable table within the range of ±0.1 mm.

According to the ninth aspect of the invention, the frame member provided at one end of the movable table is provided with the support for supporting the edge of the work piece, so that even if the work piece slides out of the mounting surface of the stationary table when replacing tools for example, it is possible to prevent the part of the work piece moved out of the mounting surface of the stationary table from sagging by its own weight. Furthermore, it is possible to prevent the sagging part of the work piece from colliding against the stationary table and from being damaged in returning to the machining position.

According to the tenth aspect of the invention, it is possible to replace the tools of the machining section efficiently without damaging the work piece while supporting the edge of the work piece by arranging the frame member as the tool mounting section for mounting tools to be replaced of the machining section.

According to the eleventh aspect of the invention, it is possible to reduce wear of the mounting surface caused by the friction with the work piece by implementing the wear-resistant treatment on the surface of the stationary table.

According to the twelfth aspect of the invention, it is possible to reduce the influence of ambient temperature changes on the machining table by forming the machining table by iron or light metal.

According to the thirteenth aspect of the invention, it is possible to prevent even a short work piece from moving out of the mounting surface of the stationary table during machining by setting the moving range of the movable table during machining within the range in which part of the work piece always overlaps with the mounting surface of the stationary table.

The above and other advantages of the invention will become more apparent in the following description and the accompanying drawings in which like numerals refer to like parts.

BRIEF DESCRIPTION OF THE DRAWINGS

FIGS. 14A and 14B are enlarged views showing a main part of the machining apparatus of the different embodiment in attaching a support for supporting a work piece to a drill mounting seat, wherein FIG. 14A is a plan view thereof and FIG. 14B is a side view thereof;

PREFERRED EMBODIMENTS OF THE INVENTION

Figure 1:
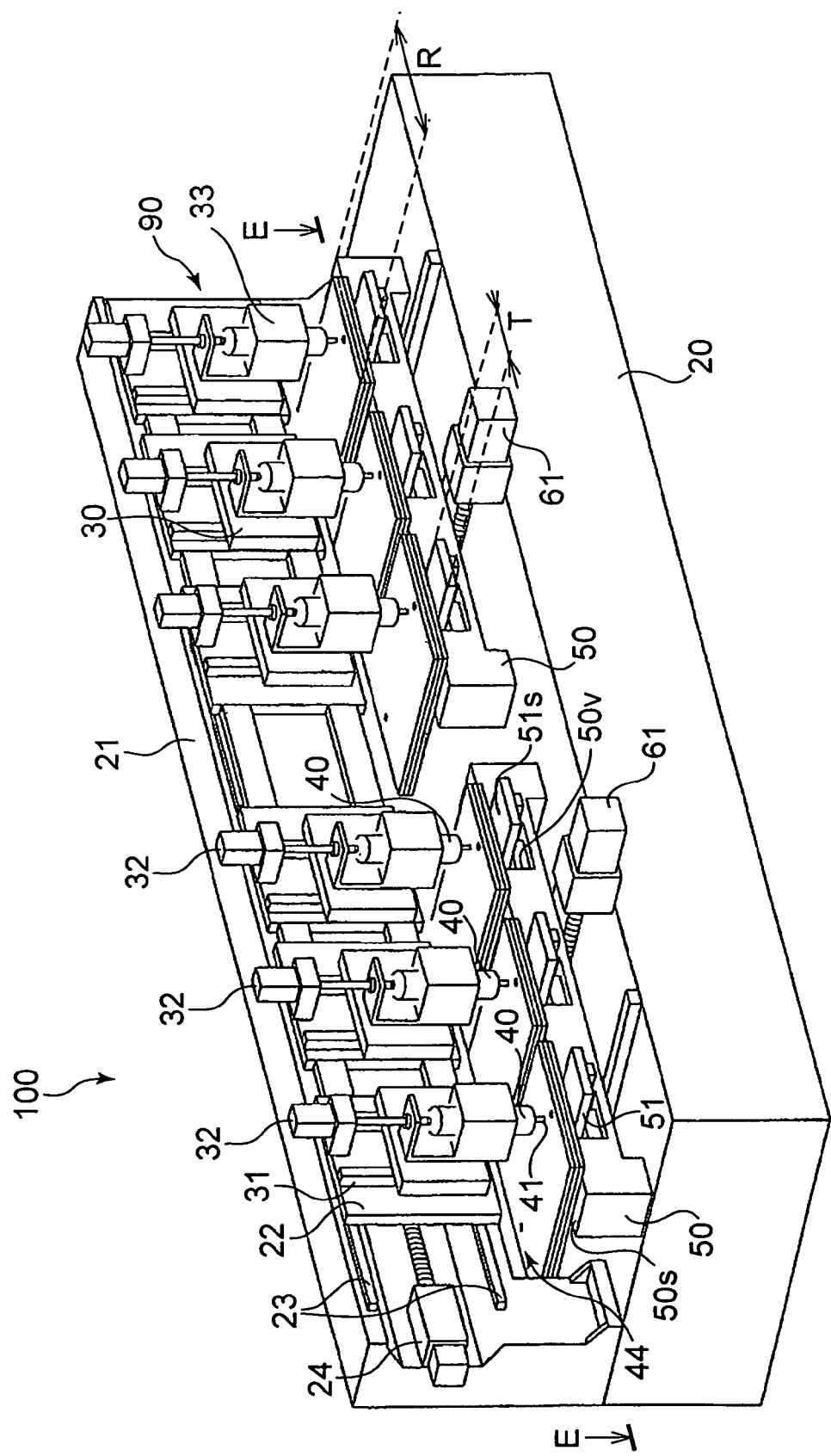
FIG. 1 is a perspective view showing a machining apparatus according to a first embodiment of the invention.
Figure 2:
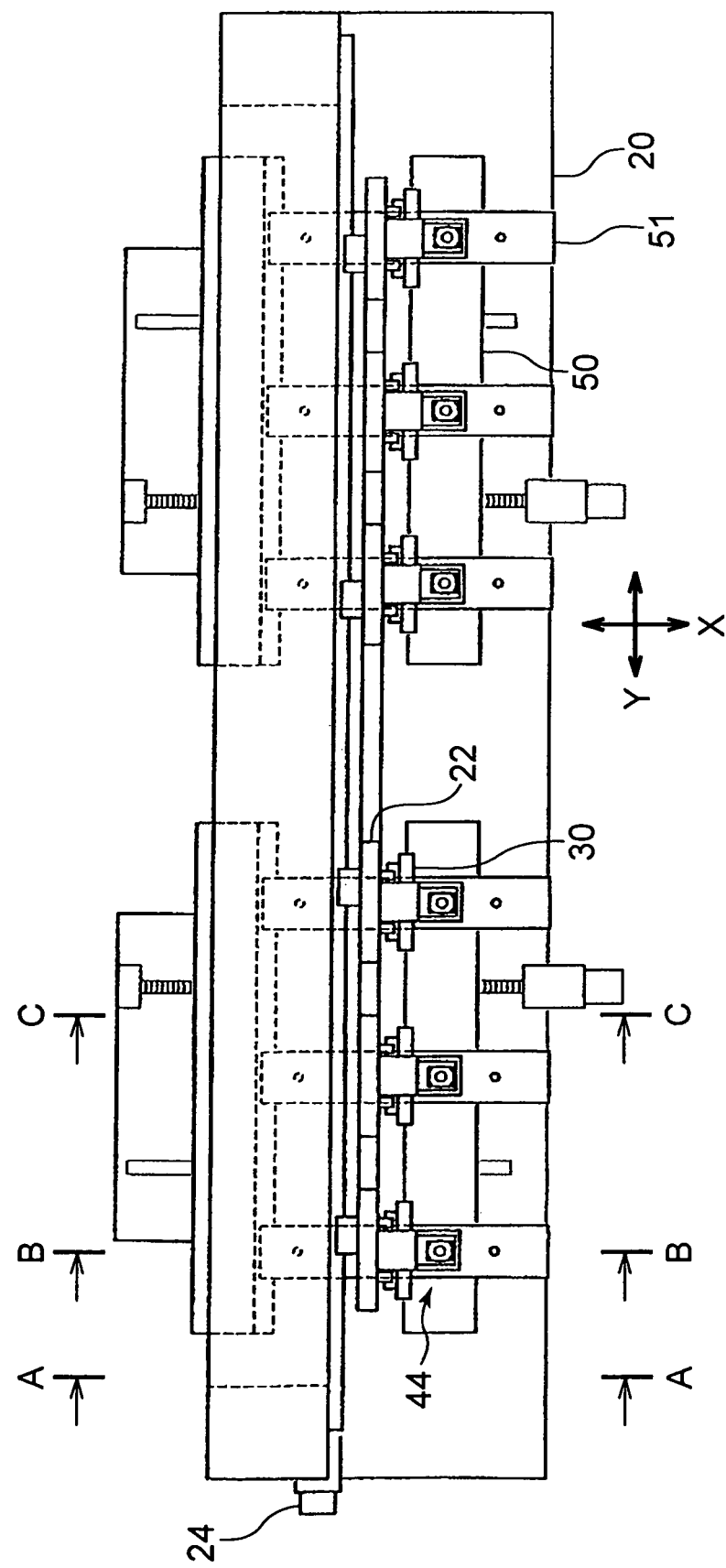
FIG. 2 is a plan view of the machining apparatus according to the first embodiment of the invention.
Figure 3:
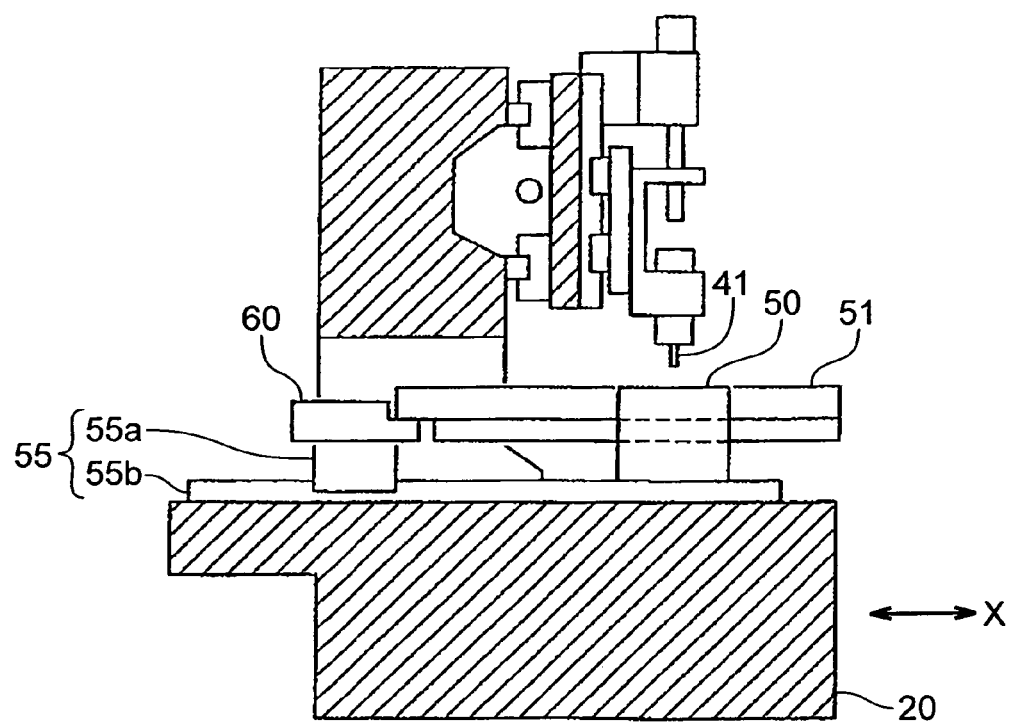
FIG. 3 is a section view taken along A-A in FIG. 2.
Figure 4:
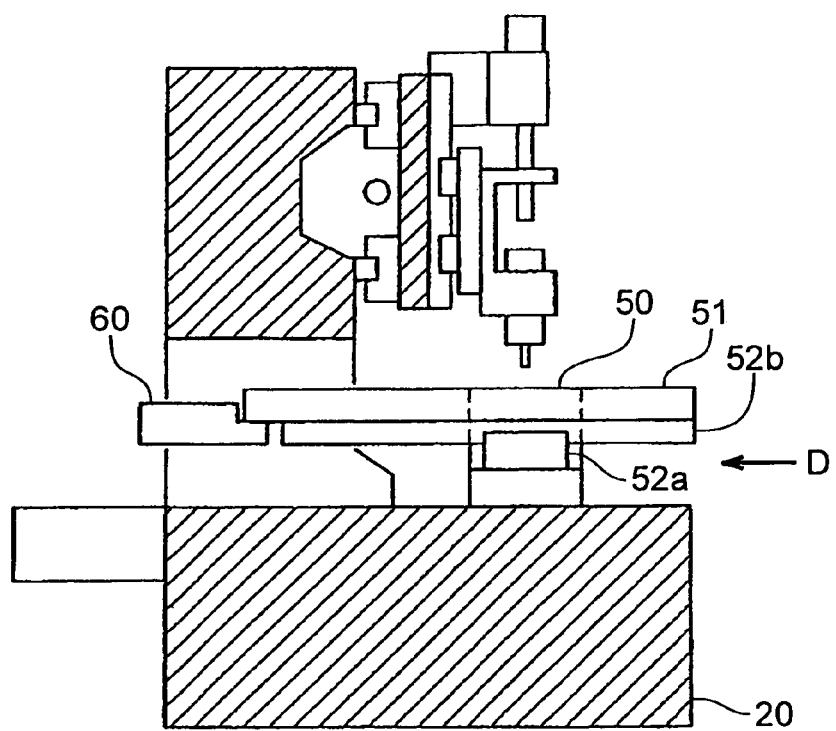
FIG. 4 is a section view taken along B-B in FIG. 2.
Figure 5:
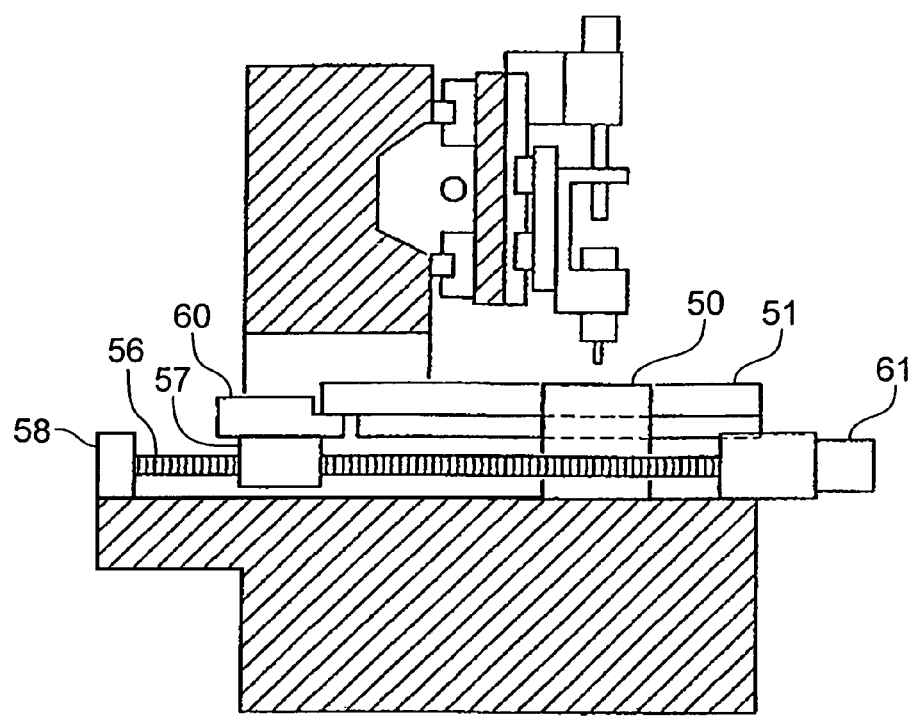
FIG. 5 is a section view taken along C-C in FIG. 2.
Figure 6:
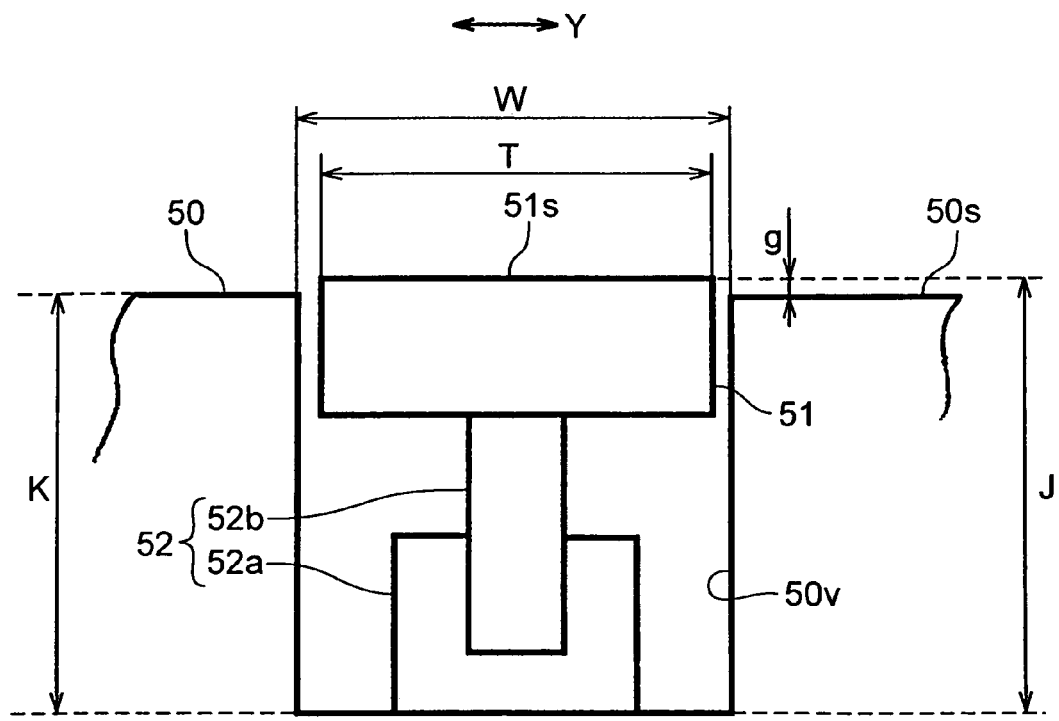
FIG. 6 is a view seen along an arrow D in FIG. 4.
Figure 7:
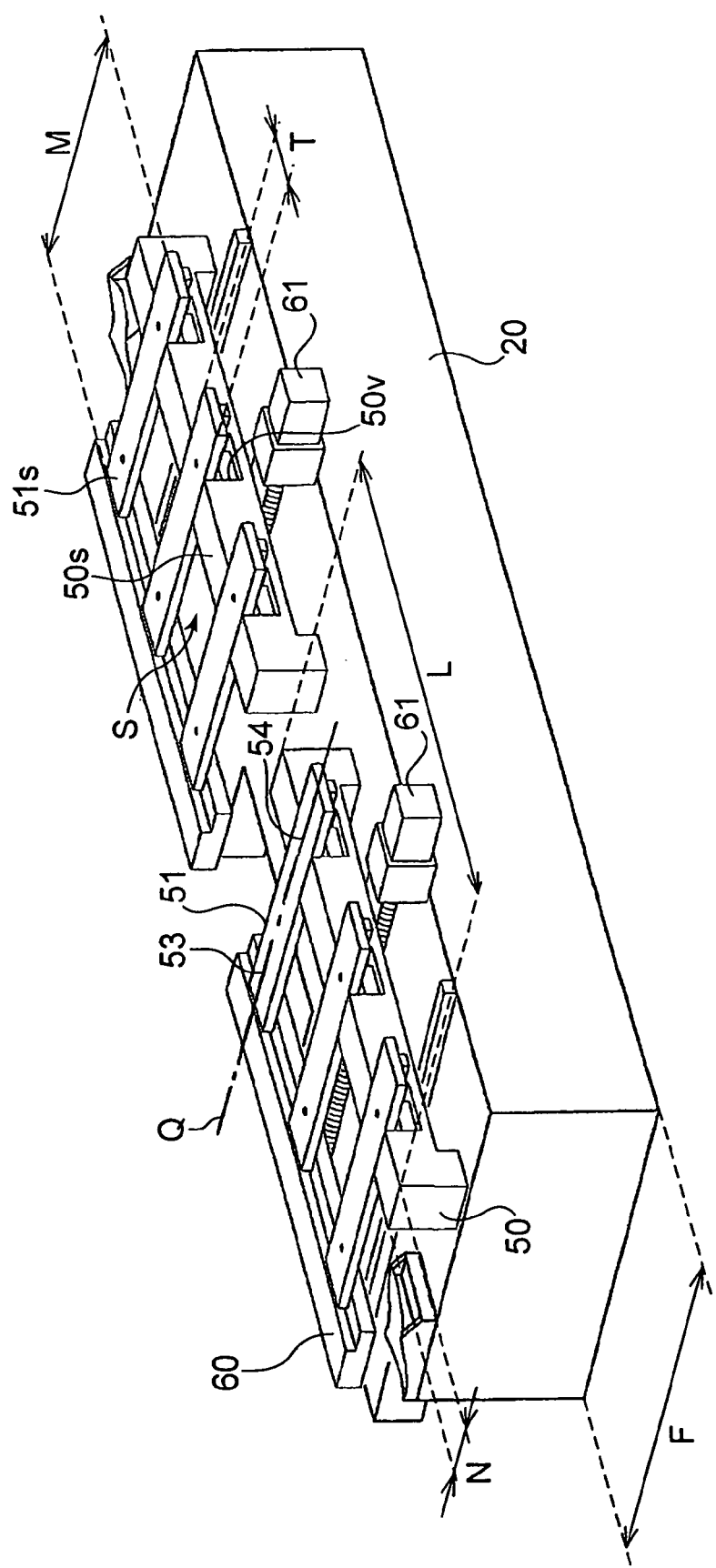
FIG. 7 is a perspective view showing a machining table according to the first embodiment of the invention.
Figure 8:
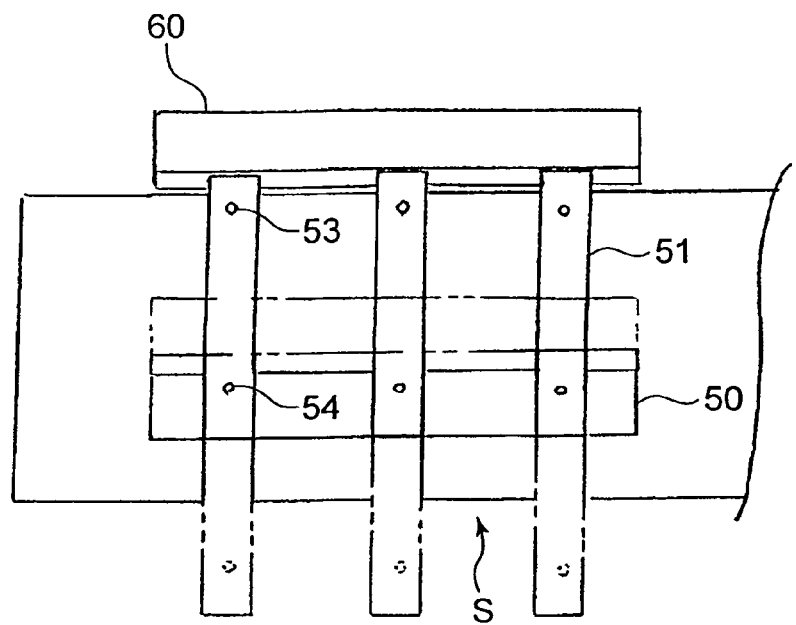
FIG. 8 is an explanatory diagram showing a movable range of a movable table according to the first embodiment of the invention.
Figure 19:
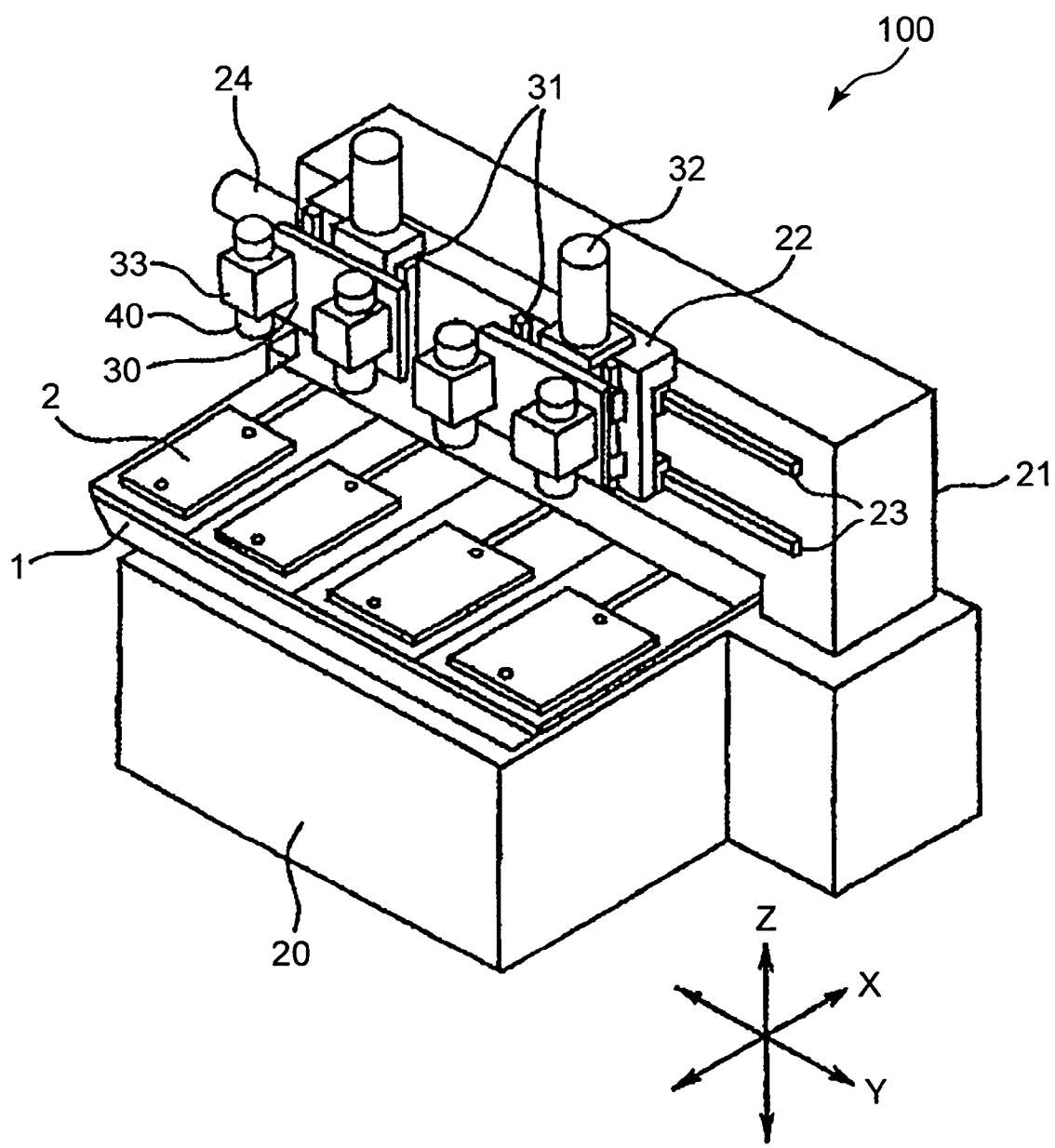
FIG. 19 is a perspective view for explaining a prior art printed circuit board drilling apparatus.
Figure 20:
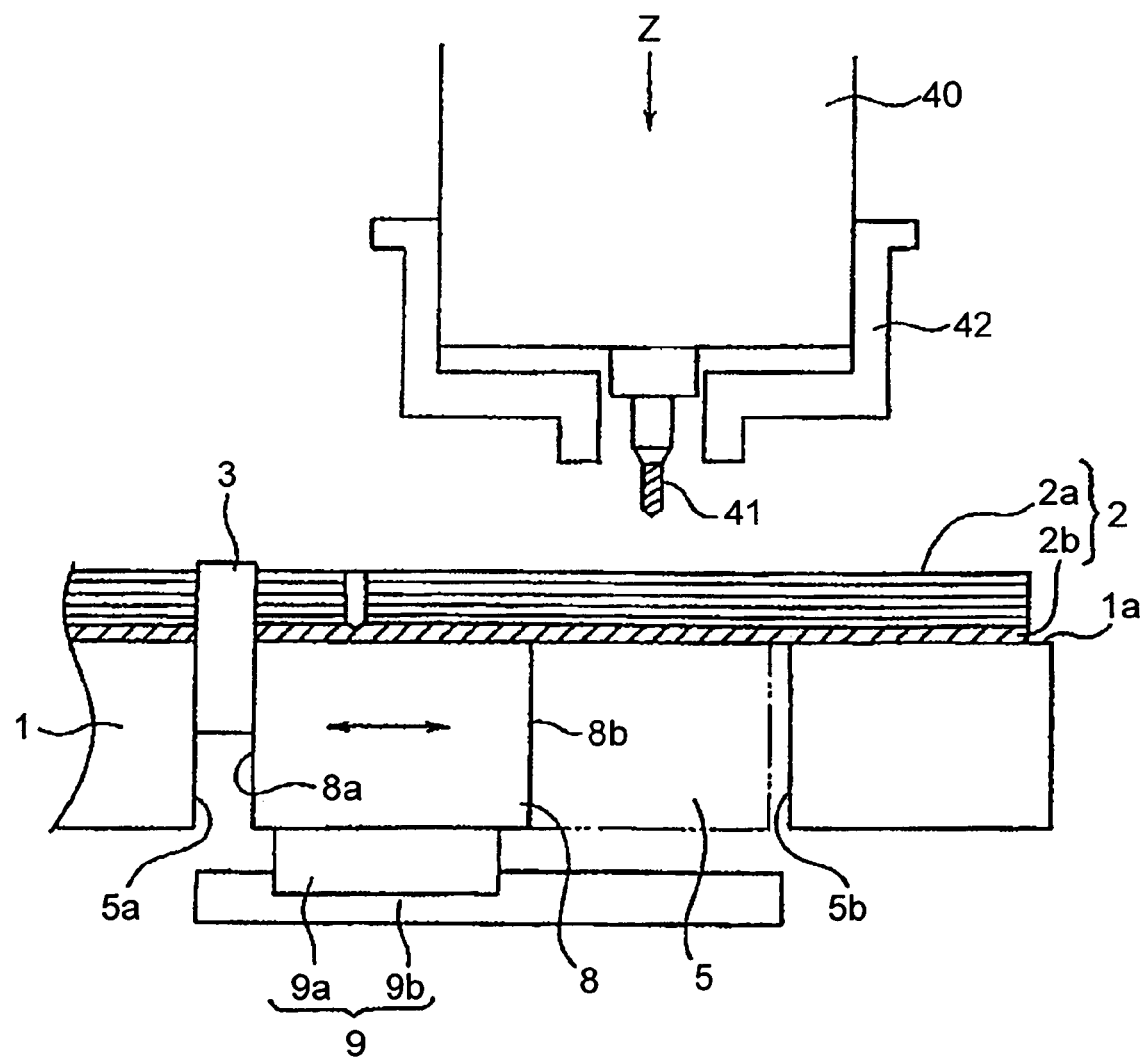
FIG. 20 is a front view of a section near a spindle of the prior art printed circuit board drilling apparatus in FIG. 19.
Figure 21:
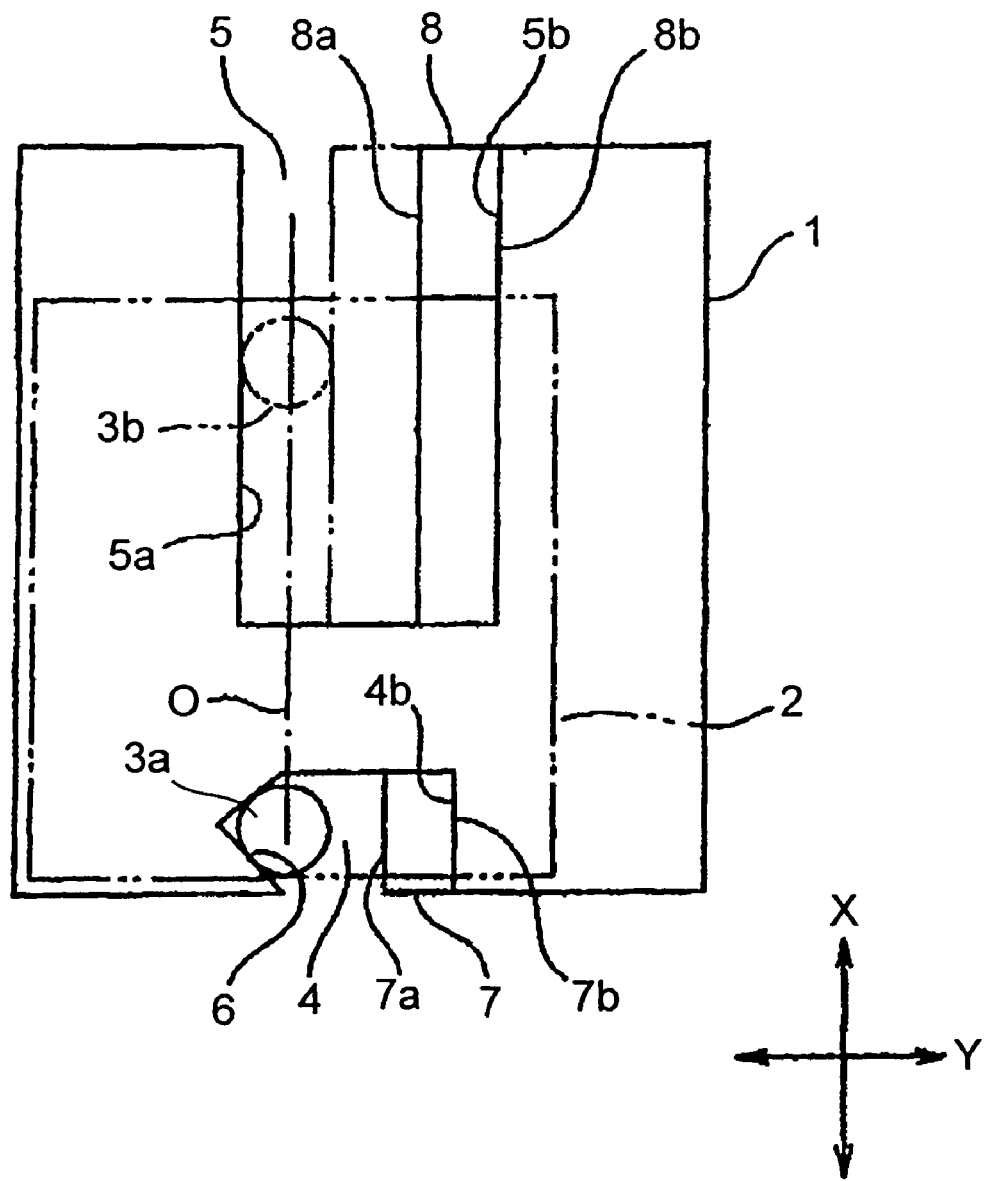
FIG. 21 is a plan view of a table of the printed circuit board drilling apparatus in FIG. 19.

FIG. 1 is a perspective view showing a drilling apparatus 100, i.e., a machining apparatus, of a first embodiment of the invention, FIG. 2 is a plan view of the machining apparatus, FIG. 3 is a section view taken along A-A in FIG. 2, FIG. 4 is a section view taken along B-B in FIG. 2, FIG. 5 is a section view taken along C-C in FIG. 2, FIG. 6 is a view seen along an arrow D in FIG. 4, FIG. 7 is a perspective view showing a machining table according to the first embodiment of the invention and FIG. 8 is an explanatory diagram showing a movable range of a movable table according to the first embodiment of the invention. The same or corresponding parts and functions in the abovementioned figures with those in FIGS. 19 through 21 are denoted by the same reference numerals and their repeated explanation will be omitted here.

Firstly, the whole arrangement of the drilling apparatus 100 will be explained. As shown in FIG. 1, two sets of cross slides 22, each including three cross slides united together, are mounted slidably on guides 23. These two sets of cross slides 22 are also linked so that they move together. Three spindles 40 are attached to a front face of each cross slide 22 in parallel at regular intervals. Each machining section 44 for machining a work piece (printed circuit board) is composed of the spindle 40, a drill 41, a pressure foot 42 described later and others.

Two stationary tables 50 are fixed on a bed (stationary member) 20. A movable table 51 arranged to be movable in a (horizontal) direction (X-axis direction) perpendicular to a moving direction (Y-axis direction) of the spindle 40 is provided at a position crossing with the stationary table 50 corresponding to each spindle 40.

The drilling apparatus 100 has two machining units 90 each of which is composed of the three spindles 40, one stationary table 50 and the same number of movable tables 51 as the spindles 40. These stationary and movable tables 50 and 51 compose machining tables 50 and 51 having surfaces (mounting surfaces) 50s and 51s for mounting the work pieces 2.

It is noted that although the drilling apparatus 100 has two machining units 90, it may have at least one machining unit 90 and the number of the spindles 40 and movable tables 51 needs not be always three. Therefore, the numbers of these machining units 90, spindles 40, movable tables 51 and stationary tables 50 may be set at any number corresponding to a specification of the drilling apparatus 100, and the number of spindles 40 and movable tables 51 may be different depending on each machining unit 90.

Next, the structure of the machining tables 50 and 51 will be explained in detail. As shown in FIGS. 2 and 7, the stationary table 50 is a table formed into a rectangular shape in plan view and into a gate-like shape when seen from its front and is formed such that a length N in its width direction is remarkably shorter than a length M in the longitudinal direction of the movable table 51. The stationary table 50 is also formed such that a length L in the longitudinal direction is at least longer than a distance (moving length) through which the machining section 44 moves in the Y-axis direction and is disposed such that its longitudinal direction runs in parallel with the Y-axis (moving direction of the machining section 44) and its width direction (X-axis direction) crosses at right angles with the axial line of the drill 41 (spindle 40). Due to that, the mounting surface 50s is under the machining section 44 and a machining area is formed on the mounting surface 50s.

The mounting surface 50s of the stationary table 50 is provided with three grooves 50v cut in the direction (X-axis direction) perpendicular to the longitudinal direction (Y-axis direction) in the stationary table 50. As shown in FIG. 6, a width W of each groove 50v is formed to be wider than a width T of the movable table 51 by about 0.1 mm each of the both sides. A bearing 52a of a linear guiding unit 52 composed of the bearing 52a and a track 52b is disposed on a bottom of the groove 50v. The track 52b is fixed under the movable table 51 and the movable table 51 is slidably supported by the groove 50v in the X-axis direction as the track 52b engages with the bearing 52a.

It is noted that while the surface 51s of the movable table 51 is described to be higher than the mounting surface 50s of the stationary table 50 by a difference g in FIG. 6, a case when the difference g is zero will be explained here. The width T of the movable table 51 is around 1/20 to 1/2 of the pitch of the grooves 50v (=the interval of the spindles 40).

As shown in FIG. 7, the movable table 51 is a rectangular plate-like table in plan view and is formed such that the length M in the direction along the groove 50v of the stationary table 50 is at least longer than the length N of the groove 50v. Further, its mounting surface 51s is formed such that the width T in the moving direction of the machining section 44 is narrower than a width R of the work piece (T<R, see FIG. 1) and is arranged to be able to mount the work piece even if the width R of the printed circuit board 2 is larger than the width T.

Further, the movable table 51 is provided with first and second holes 53 and 54 for inserting reference pins 3a and 3b on the center line Q of the mounting surface 51s of the movable table 51 on which the printed circuit board 2 is to be mounted. The movable table 51 is arranged such that the printed circuit board 2 may be fixed on the mounting surface 51s of the movable table 51 and the center of gravity of the printed circuit board 2 is located on the mounting surface 51s by inserting the reference pins 3a and 3b into these first and second holes 53 and 54.

Furthermore, the movable tables 51 on one stationary table 50 are linked together by means of a connecting plate 60 per each machining unit 90 and the connecting plate 60 is provided with a bearing 55a of a linear guiding unit 55 composed of the bearing 55a and a track 55b under thereof. The track 55b is fixed on the bed 20 while oriented along the X-axis direction.

Additionally, a nut 57 that is engaged with a ball screw 56 is disposed under the connecting plate 60 as shown in FIG. 5. One end of the ball screw 56 is connected to a bearing 58 fixed on the bed 20 and another end is connected with an output shaft of a motor 61. Accordingly, it is possible to move the three movable tables 51 simultaneously in the X-axis direction with the connecting plate 60 by driving the motor 61.

It is noted that a moving range of the movable table 51 during machining (drilling) is a range from position indicated by alternately long- and double short-dashed lines in FIG. 8 (utmost limit position where the connecting plate 60 does not contact with the stationary table 50 in FIG. 3) to position indicated by a solid line (left-edge position of the track 55b in FIG. 3). Then, when the movable table 51 is positioned at the position indicated by the alternately long- and double short-dashed line, the hole 53 is positioned on the stationary table 50.

The machining tables 50 and 51 are arranged so that the longitudinal direction of one stationary table 50 crosses at right angles with that of at least one movable table 51 as described above and so as to support a part of the printed circuit board 2 by the mounting surfaces 50s and 51s while leaving areas S surrounded by long sides of the movable and stationary tables 51 and 50 that do not support the printed circuit board 2.

Next, operations of the invention will be explained. Firstly, the printed circuit board 2 is positioned and fixed on the movable table 51 by inserting the reference pins 3a and 3b of the printed circuit board 2 into the holes 53 and 54. The movable table 51 is positioned so that the hole 53 is located on the stationary table 50 at this time, so that part of the printed circuit board 2 is disposed on the stationary table 50. The movable table 51 moves the printed circuit board 2 whose area is larger than that of the movable table 51 in the X-axis direction relatively to the mounting surface 50s of the stationary table 50 in this state.

When the position in the X-axis direction of the printed circuit board 2 is determined, the cross slide 22 is moved in the Y-axis direction to position the axial line of the drill 41 (spindle 40) to the center of a hole to be machined to determine machining position and then a saddle 33 is moved in the Z-axis direction. When the saddle 33 is moved in the Z-axis direction, the pressure foot 42 presses and holds the printed circuit board 2 against the mounting surface 50s of the stationary table 50 or the mounting surface 51s of the movable table 51 at the part crossing with the stationary table 50 at first and then the drill 41 drills the printed circuit board 2 thus held.

When one sequence of drilling ends, the machining position is changed by moving the axial line of the drill 41 in the Y-axis direction by the cross slide 22 to drill next. When there is no more hole to be drilled over the printed circuit board 2 on the stationary table 50, the printed circuit board 2 is moved in the X-axis direction by the movable table 51 to repeat the abovementioned process.

It is noted that although there would be a part out of the movable table 51 (not supported by the movable table 51) when the width of the printed circuit board 2 in the Y-axis direction is wider than the width T of the movable table 51, edges of the printed circuit board 2 will not interfere with edges of the stationary table 50 when the movable table 51 moves in the X-axis direction because the printed circuit board 2 is supported by the backing plate 2b whose rigidity is large and a surrounding part of the machining point of the printed circuit board 2 is always supported by the stationary table 50 in machining the printed circuit board 2.

Furthermore, because the surrounding part of the machining section is supported by the stationary table 50, the printed circuit board 2 is firmly held by the mounting surfaces 50s and/or 51s of the stationary table 50 or of the movable table 51 at the part crossing with the stationary table 50 and will not be inclined, slanting the axial line of the holes in the plate thickness direction during machining, even if the printed circuit board 2 is pressed by the pressure foot 42 and others during machining.

Machining accuracy and machining quality may be improved by cutting into the printed circuit board 2 by the drill 41 (see FIG. 20) while pressing the part surrounding the machining section of the printed circuit board 2 by the pressure foot 42 by constructing the drilling apparatus 100 as described above.

Additionally, position of the printed circuit board 2 having the area larger than that of the movable table 51 may be changed by moving the light-weight movable table 51. Further, because the machining tables 50 and 51 are formed into a shape of a grate in which the plurality of movable tables 51 cross with one stationary table 50 and are disposed in parallel at regular intervals, the areas S that do not support the printed circuit board 2 are created, which is lightening the machining table as a whole, and friction between the printed circuit board 2 and the mounting surface 50s of the stationary table 50 may be reduced.

Furthermore, because the movable table 51 supports the center of gravity of the printed circuit board 2 by the mounting surface 51s, it can convey the printed circuit board 2 firmly even if the area of the printed circuit board 2 is larger than that of the movable table 51.

Further, even if the number of spindles 40 is increased, the increase of weight of the table to be moved is only the weight of the increased movable tables 51, so that the weight increasing rate of the table to be moved may be remarkably reduced as compared to one moving the whole machining table. Accordingly, the efficiency for drilling the printed circuit board 2 may be improved, the driving unit may be downsized, and machining speed and accuracy may be improved.

Furthermore, because the machining area of the spindle 40 is created on the stationary table 50, the machining table can firmly hold the printed circuit board 2 by the mounting surface 50s of the stationary table 50 or the mounting surface 51s of the movable table 51 at the part crossing with the stationary table 50 and allows the printed circuit board 2 to be steadily machined even if the machining table has the areas S not supporting the printed circuit board 2.

Moreover, the movable table 51 is formed into the shape in which the length M in the X-axis direction is short, so that a length F in the X-axis direction of the bed 20 may be also shortened. Accordingly, together with the lightening of the machining tables 50 and 51 themselves, the weight of the whole drilling machine 100 may be remarkably reduced.

Figure 9:
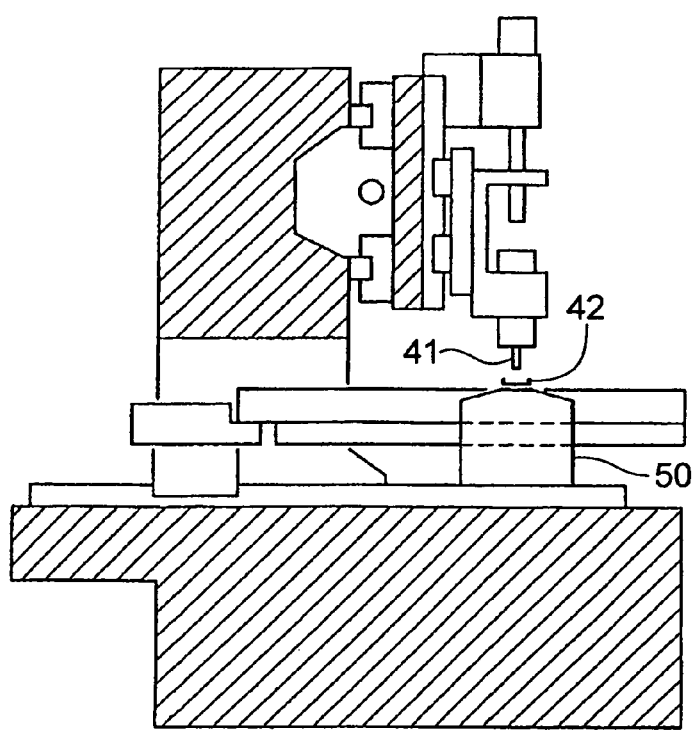
FIG. 9 is a section view showing a modified example of a stationary table according to the first embodiment of the invention.

Next, a modified example in which the width in the X-axis direction of the surface 50s of the stationary table 50 is slightly widened more than the diameter of the pressure foot 42 will be explained. As shown in FIG. 9, the stationary table 50 is provided with the surface 50s whose peripheral portion, other than the part abutting with the pressure foot 42, is inclined downward and the width of the mounting surface 50s is reduced to the diameter of the pressure foot 42. It is possible to reduce frictional force otherwise generated when the printed circuit board 2 moves by reducing the width of the stationary table 50. Furthermore, it is possible to arrange so that an edge of the printed circuit board 2 does not collide with the edge of the stationary table 50 by forming such that the edge of the stationary table 50 in the X-axis direction is inclined downward.

By the way, the level of the surface 50s of the stationary table 50 is equalized with the surface 51s of the movable table 51 (difference g=0) in the embodiment described above, so that the lower surface of the printed circuit board 2 moves on the surface 50s during machining. Accordingly, it is desirable to implement a wear-resistant treatment on the surface 50s. The wear-resistant treatment may be implemented by carrying out a quenching treatment or nitriding treatment on the stationary table 50 by making of steel or by coating ethylene hexafluoride. Or, although not shown, the stationary table 50 may be arranged to have a two-layer structure composed of a base portion and a surface portion so that the surface portion may be replaced.

The surface 51s of the movable table 51 may be higher than the surface 50s of the stationary table 50 (i.e., the difference g may be around 0 to +0.1 mm) as shown in FIG. 6. It is possible to reduce the friction of the surface 50s by increasing the level of the surface 51s more than the surface 50s. In contrary, when the surface 51s is set lower than the surface 50s (i.e., the difference g is around 0 to −0.1 mm), the friction of the holes 53 and 54 may be reduced because up and down movements of the printed circuit board 2 during machining are reduced.

It is noted that the difference g in level between the surface 51s of the movable table 51 and the surface 50s of the stationary table 50 is set within a range that allows the work piece to be retained with its flexibility without being damaged by the mounting surface 50s of the stationary table 50 when the work piece is pressed by the pressure foot 42 and others. This range is preferable to be ±0.1 mm as described above in the case of the printed circuit board 2.

Figure 10:
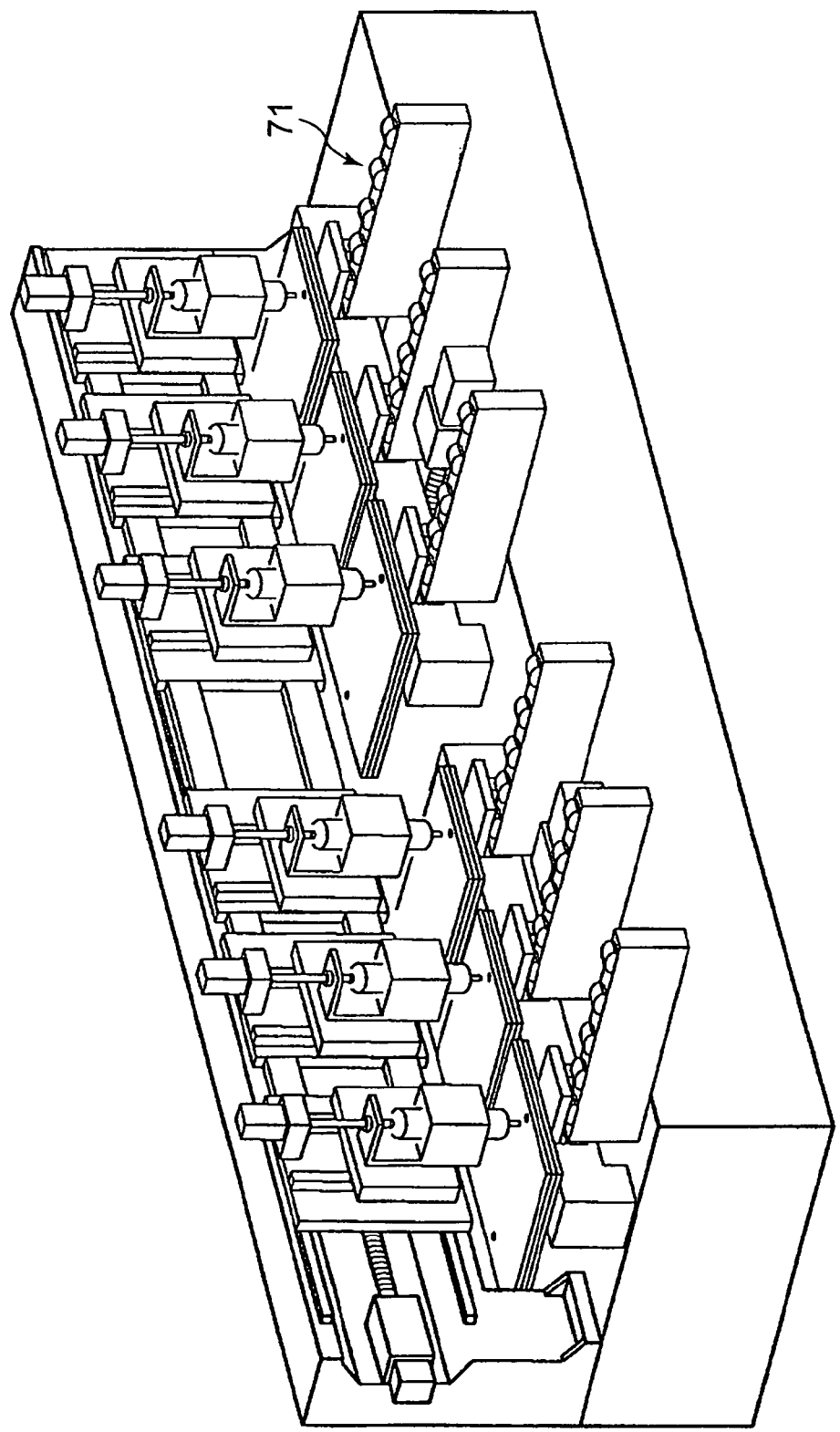
FIG. 10 is a perspective view showing a machining apparatus according to another embodiment of the invention.
Figure 11:
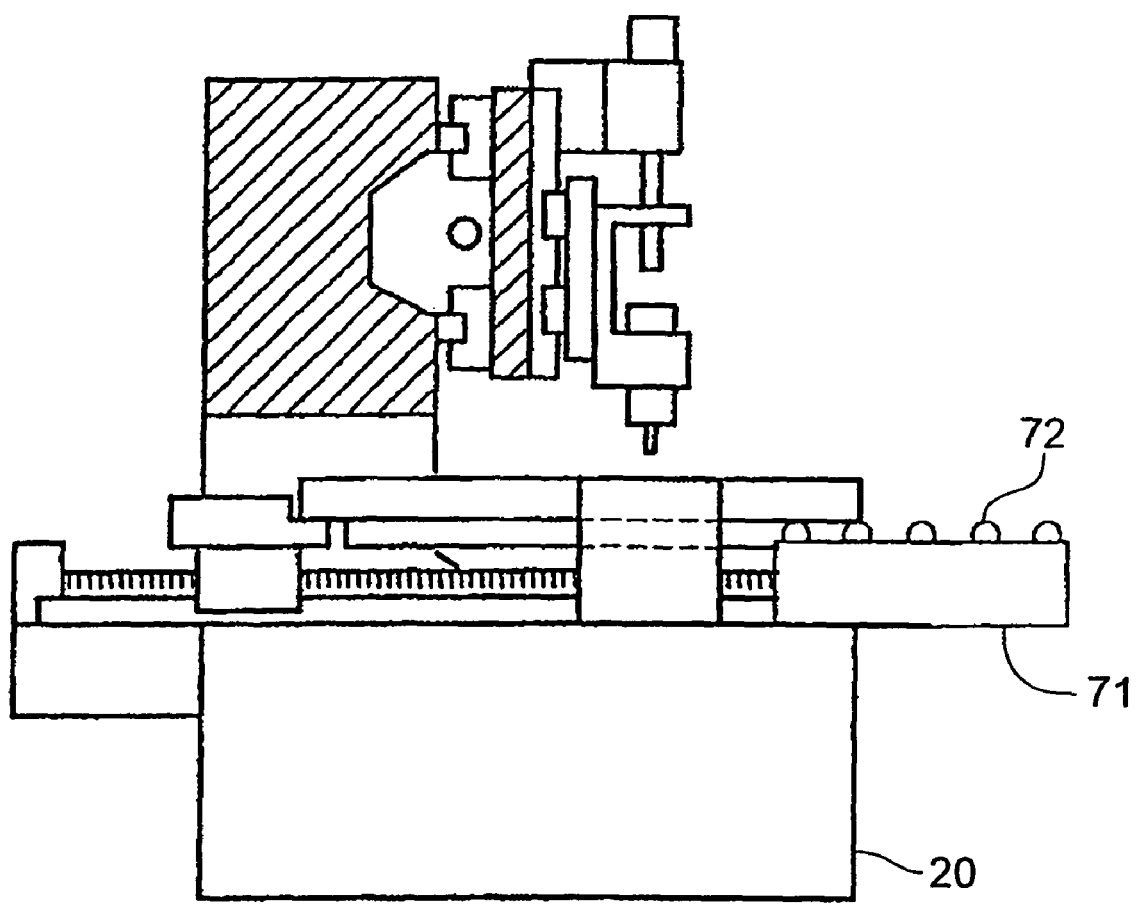
FIG. 11 is a side section view of FIG. 10.

FIG. 10 is a perspective view showing a machining apparatus according to another embodiment of the invention and FIG. 11 is a side section view of FIG. 10. This embodiment is a case when a supporting unit 71 of the movable table 51 is provided on the bed 20. A plurality of cylindrical rollers 72 is disposed in the supporting unit 71 so as to support the movable table 51. This arrangement allows a life of the bearing 52a to be prolonged because load applied to the bearing 52a is reduced when the length of the movable table 51 in the X-axis direction is extended.

Figure 12:
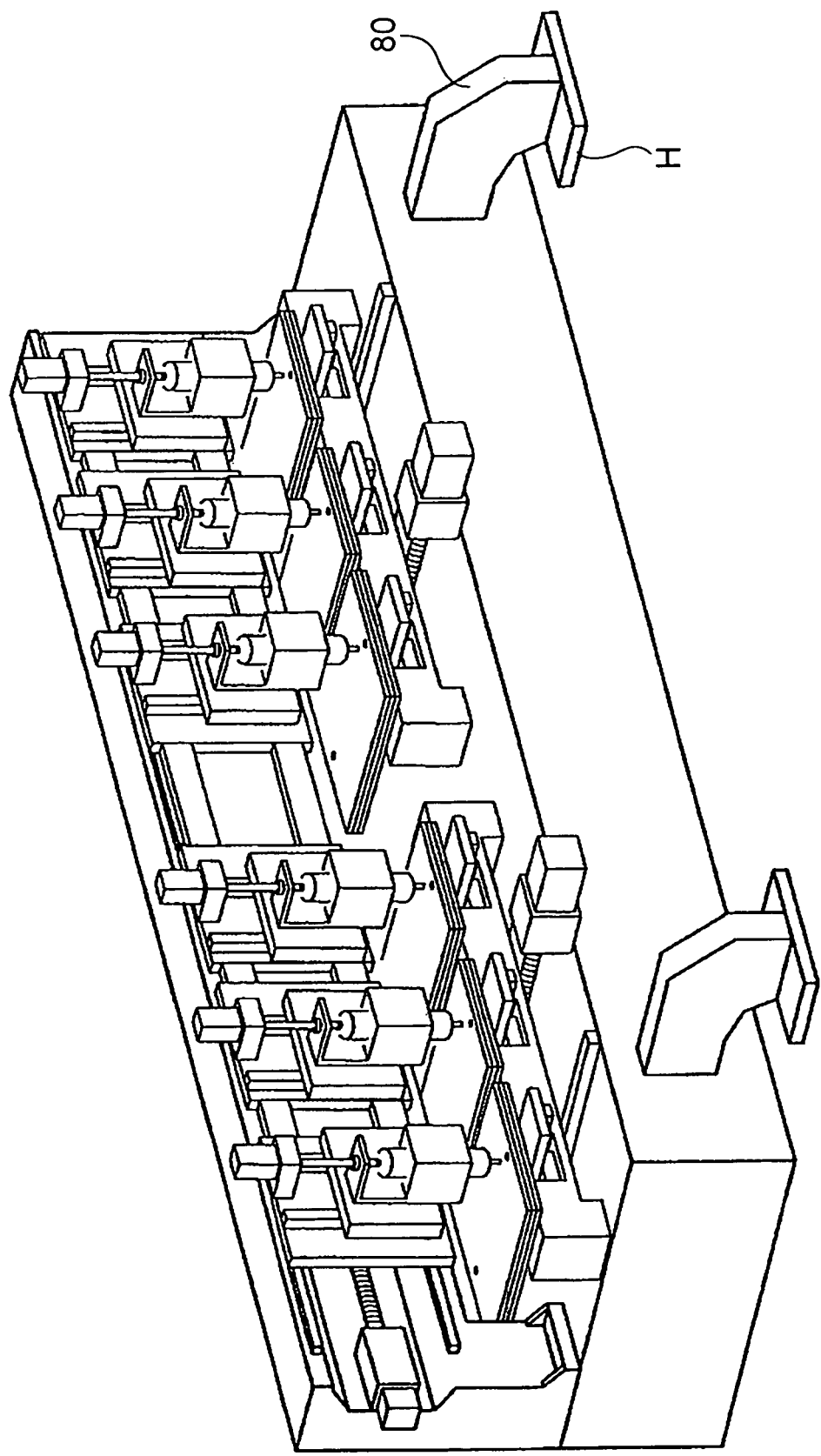
FIG. 12 is a perspective view showing a machining apparatus according to a different embodiment of the invention.
Figure 13:
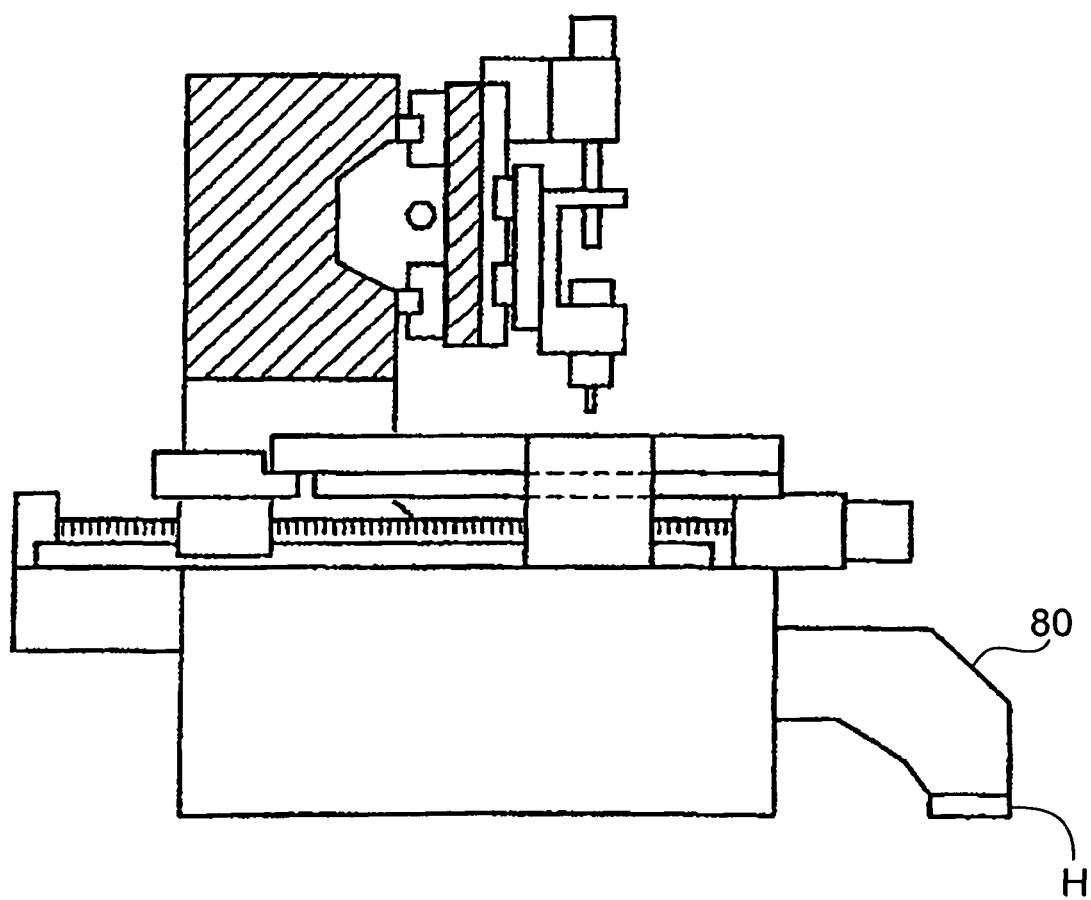
FIG. 13 is a side section view of FIG. 12.

FIG. 12 is a perspective view showing a machining apparatus according to a still different embodiment of the invention and FIG. 13 is a side section view of FIG. 12. This embodiment is a case when supports 80 are added to the bed 20. While the length N in the X-axis direction of the stationary table 50 for supporting the movable table 51 may be shortened because the movable table 51 may be constructed in light weight in the case of the invention and due to that, the length F in the X-axis direction of the bed 20 on which the stationary table 50 is fixed may be also shortened, there may be a case when the whole apparatus becomes unstable. In such a case, the apparatus may be stabilized by providing the L-shaped supports (bed fixing member) 80 as shown in the figures. It is noted that in the figures, position of the support 80 distant most from the bed 20 (point H in the figures) is edge position of the prior art bed 20. As it can be seen from these figures, a total weight of the printed circuit board drilling apparatus having six spindles for example may be cut by around 2,000 kg (around 25% of the total weight) owing to the invention.

Furthermore, although the present embodiment is provided with the two stationary tables 50, six movable tables 51 may be engaged with one stationary table 50. In this case, only one motor 61 is required.

Further, the width T of the movable table 51 may be matched with the diameter of the pressure foot 42.

The hole 53 also may not be circular and may be oval. It is also possible to arrange so that the reference pins 3a and 3b engaged with the holes 53 and 54 are pressed in a direction perpendicular to an axial line of the reference pins 3a and 3b by pressing members in the same manner as the case of FIG. 21.

Further, although the printed circuit board 2 is fixed to the movable table 51 only by the reference pins 3a and 3b in the embodiment described above, stationary members other than the reference pins 3a and 3b may be provided.

By the way, when the machining apparatus is the printed circuit board drilling apparatus, because the number of holes that may be drilled by one drill is around 3,000 and there exist plural diameters of the holes to be drilled, machining is carried out by replacing the drills. Then, a drill mounting seat (tool mounting section) 70 laterally extending (extending in the Y-axis direction) from the movable table 51 is attached at an edge of the movable table 51 on the side opposite from the side where the connecting plate 60 is attached as shown in FIG. 14. A plurality of drill cassettes 70a (six in the figure) for holding a plurality of drills 41 and two drill holders 72a and 72b capable of holding the drills 41 are mounted in the drill mounting seat 70. It is noted that a surface of the bottom surface of the drill mounting seat 70 other than a part contacting with the movable table 51 is higher than the surface of the movable table 51 by more than 0.5 mm and may overhang over the stationary table 50.

The drill 41 to be used next is mounted in the drill holder 72a and no drill 41 is mounted in the drill holder 72b. When the drill 41 is replaced, the axial line of the drill holder 72a or the drill holder 72b is aligned with the axial line of the spindle 40 in advance and after mounting the drill 41 held in the spindle 40 into the drill holder 72b, the drill 41 to be used next mounted in the drill holder 72a is held by the spindle 40. It is noted that the drill 41 held in the drill cassette 71 is mounted in the drill holder 72a or is returned from the drill holder 72b to the drill cassettes 70a by means not shown.

Figure 15:
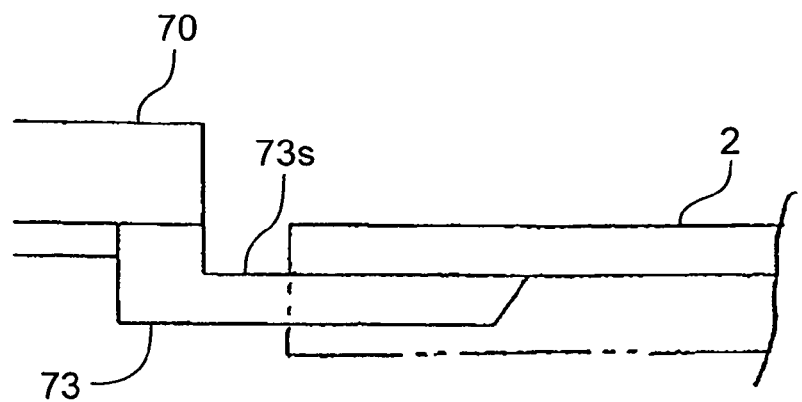
FIG. 15 is an explanatory diagram showing a relationship between the support and a printed circuit board.

The length in the X-axis direction of the printed circuit board 2 varies. When the length in the X-axis direction of the printed circuit board 2 is short, the printed circuit board 2 may slide out of the mounting surface of the stationary table in replacing the drills 41 as shown in FIG. 14. The part of the printed circuit board 2 moving out of the movable table 51 sags due to gravity and level of lower edges of the printed circuit board 2 at both ends in the width direction may become lower than the surface of the stationary table 50 as indicated by an alternately long- and double short-dashed line in FIG. 15. In this case, the edges of the printed circuit board 2 collide against the side surface of the stationary table 50 and the printed circuit board 2 is damaged if the movable table 51 is moved to the machining position so that the printed circuit board 2 is mounted on the stationary table 50.

Then, the drill mounting seat 70 is provided with supports 73 for supporting edges of the printed circuit board 2 and grooves 50g for preventing the collision with the supports 73 are provided at positions corresponding to the supports 73 of the stationary table 50 along the width direction of the stationary table 50. The supports 73 are arranged so as to be movable without colliding against the stationary table 50 by passing through the grooves 50g.

It is noted that a width in the Y-axis direction of the support 73 is 5 mm for example and a length thereof in the X-axis direction is a length that supports an edge of the printed circuit board 2 by 10 mm for example. The support 73 is also arranged so that its level from its surface 73a is on the same level as the surface 50s of the stationary table 50. Further, the stationary table 50 is provided with the plurality of grooves 50g (four in one side in the figure) so that the intervals of the support 73 in the Y-axis direction may be changed corresponding to the width of the printed circuit board 2. It is noted that the width in the Y-axis direction of the groove 50g is wider than the width in the Y-axis direction of the support 73 by 0.1 to 0.5 mm on each side.

Figure 16:
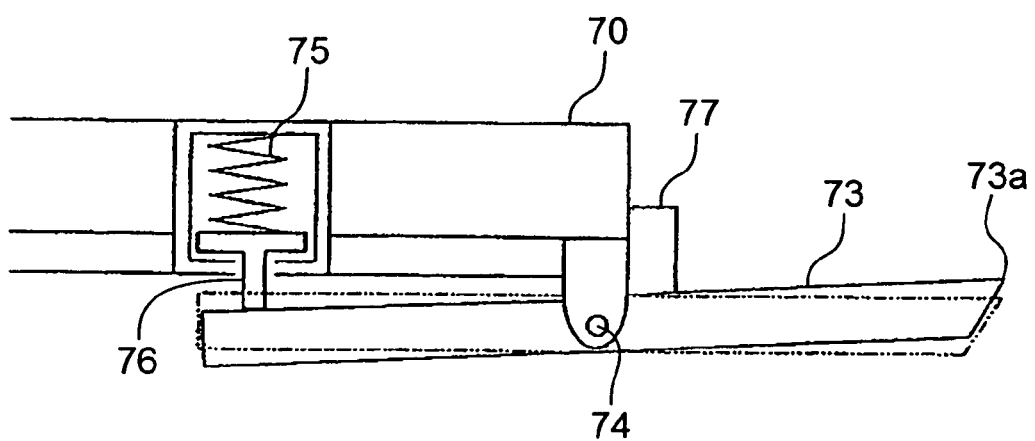
FIG. 16 is an explanatory diagram showing a modified example of the support.

FIG. 16 is an explanatory diagram showing a modified example of the support 73. The support 73 is turnable centering on an axis 74 retained by the drill mounting seat 70. A spring 75 biases one end of the support 73 downward in the figure through a piece 76. A stopper 77 positions the support 73 biased by the spring 75 at position indicated by a solid line. Another end 73a of the support 73 indicated by the solid line is positioned above the surface 50s of the stationary table 50 by 1 mm. When the end 73a is pressed down going against the spring 75, the end 73a is lowered to the level lower than the surface 50s of the stationary table 50. It is noted that biasing force of the spring 75 is selected to be such a value that biases the stopper 77 by force of about 200 g while supporting the printed circuit board 2 by the support 73.

The end of the printed circuit board 2 is higher than the surface 50s of the stationary table 50 in the case of this support 73, so that the printed circuit board 2 will not collide against the side surface of the stationary table 50. Furthermore, when the printed circuit board 2 around the end 73a is machined, the lower surface of the printed circuit board 2 becomes on the same level as the surface 50s of the stationary table 50 by being pressed down by the pressure foot 42 whose biasing force is several kg. Accordingly, it is necessary to bring the position of the surface 73s of the support 73 in line with the level of the surface 50s of the stationary table 50 in advance, so that not only dimensional tolerance of the support 73 may be increased but also assembly of the apparatus becomes easy.

It is noted that although the support 73 is attached to the drill mounting seat 70 movably in the Y-axis direction in the embodiment described above, the drill mounting seat 70 may be simply a frame member extending in the Y-axis direction.

By the way, while the case of using the reference hole 53 closer to the stationary table 50 as the base among the two reference holes 53 and 54 has been explained in the embodiment described above, the reference hole 54 distant from the stationary table 50 may be also used as the base. Such a case will be explained next.

When the reference hole 54 distant from the stationary table 50 is used as the base, there will be a case when the part of the printed circuit board 2 on the stationary table 50 side slides out of the stationary table 50 if the printed circuit board 2 mounted on the movable table 51 is short in the X-axis direction. If the printed circuit board 2 moves out of the stationary table 50, there is a possibility that the edge of the printed circuit board 2 collides against the stationary table 50 when the movable table 51 is moved to machine the printed circuit board 2. Then, when the reference hole 54 is used as the base, center coordinates Xa of the reference hole 54 is determined based on a mechanical original point O (this is an original point of the apparatus and the X and Y coordinates are determined based on this original point) so that the printed circuit board 2 will not slide out of the stationary table 50 in mounting the printed circuit board 2 on the movable table 51. It is noted that X coordinate Xa0 of the reference hole 54 by which the printed circuit board 2 specifically longest in the X-axis direction may be mounted is decided as reference work piece mounting position here and the movable table 51 is positioned at the reference work piece mounting position unless otherwise specified.

Figure 17:
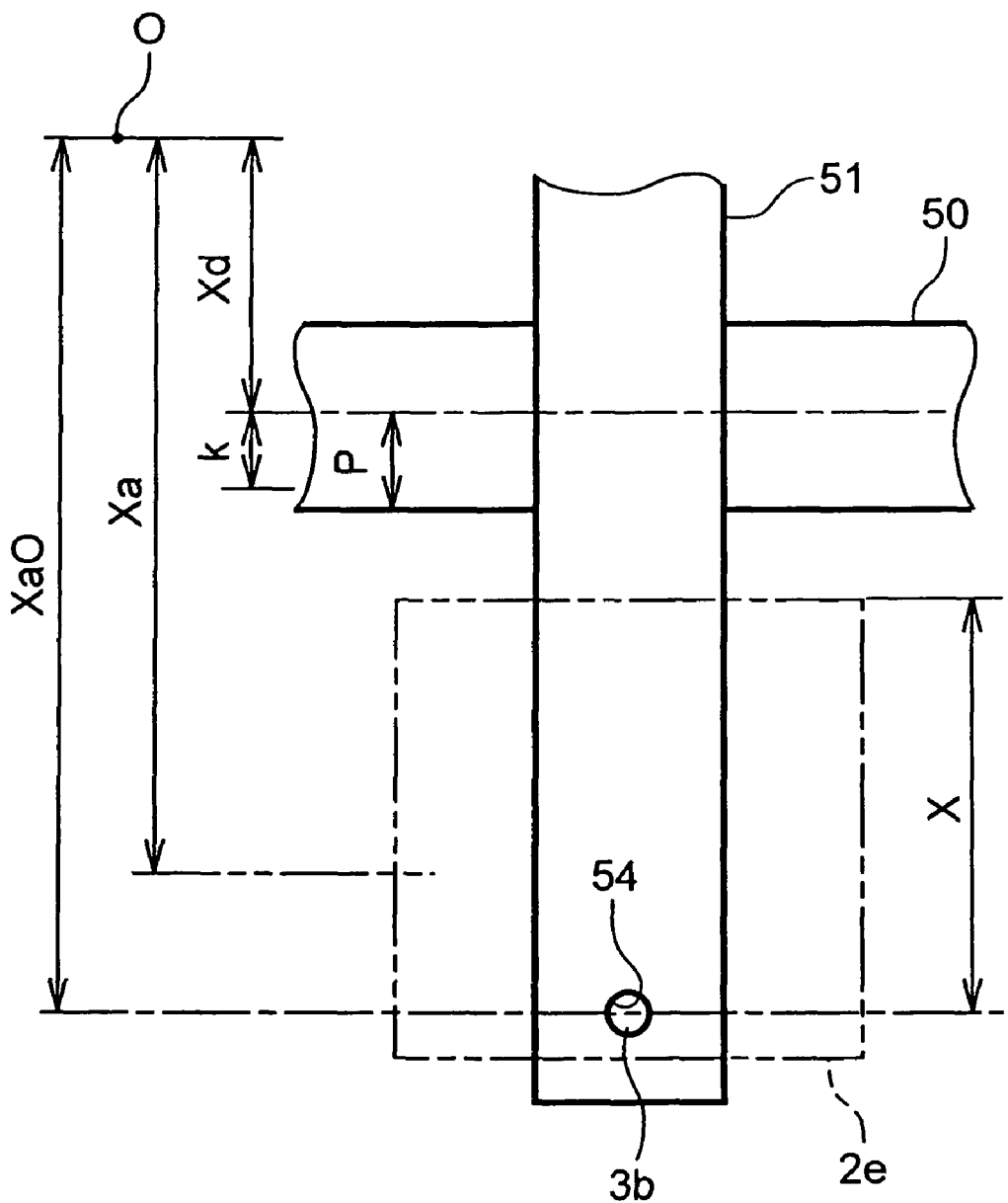
FIG. 17 is an explanatory diagram showing a positional relationship between a work piece and the stationary table based on a reference hole on the side distant from the stationary table.
Figure 18:
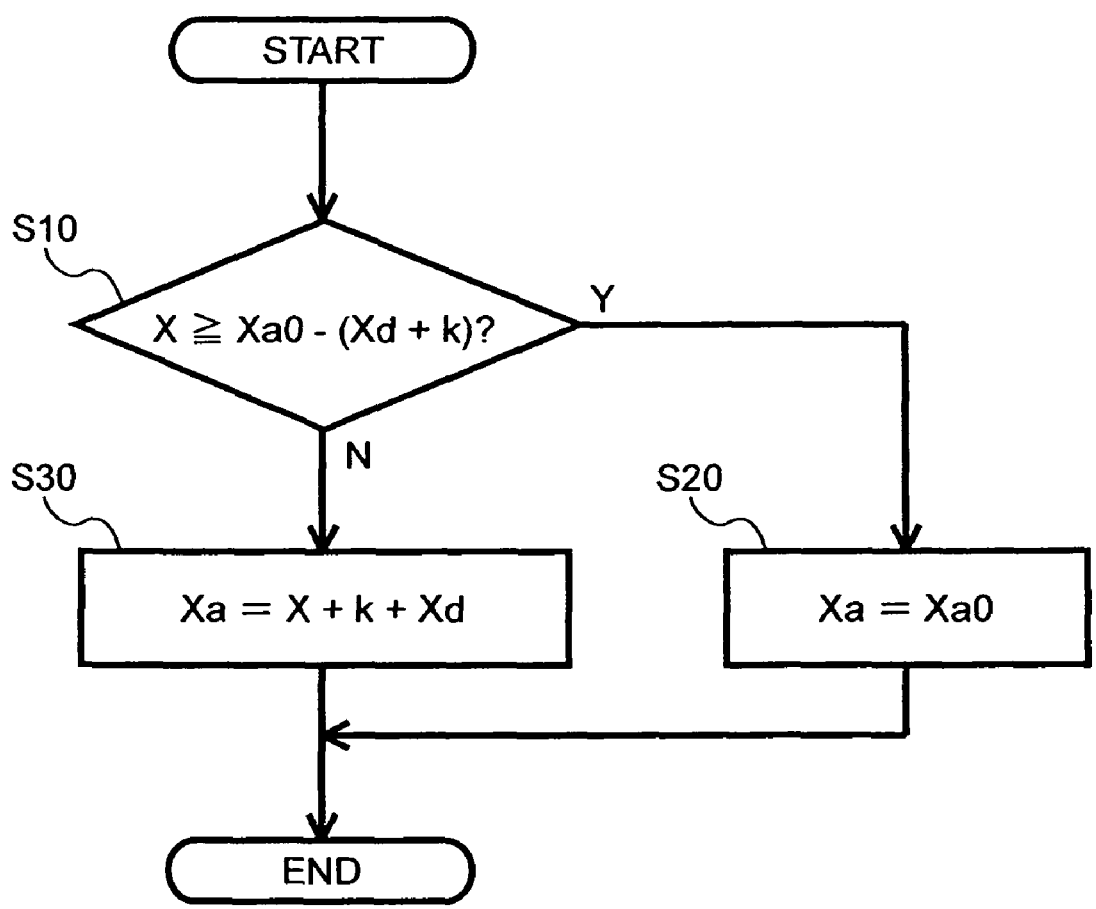
FIG. 18 is a flowchart of a procedure for positioning the movable table.

FIG. 17 is an explanatory diagram showing a positional relationship between the work piece and the stationary table based on the reference hole on the side distant from the stationary table and FIG. 18 is a flowchart of a procedure for positioning the movable table 51. In FIG. 17, the reference character (Xd) is X coordinate of an axial line of rotation of the spindle 40, i.e., the drill 41, with respect to the mechanical original point O. (k) is a distance from Xd and a distance by which the printed circuit board 2 is mounted at least on the mounting surface 50s of the stationary table 50 is determined further in advance. It is noted that a value of k is predetermined to be less than (p−1) mm if the width in the X-axis direction of the surface 50s of the stationary table 50 is 2 p (that is, the printed circuit board 2 is mounted on the surface 50s by at least 1 mm or more).

(X) represents a distance from the center of the reference pin 3b to the reference hole 53 of the printed circuit board 2 (on the far side), i.e., a length in the X-axis direction of the machining area of the printed circuit board 2.

A controller not shown determines the coordinate Xa of the work piece mounting position of this time as follows. That is, when the work piece mounting position is confirmed, the controller confirms whether or not X is more than (Xa0−(Xd+k)) in Step S10. Then, when X≧(Xa0−(Xd+k)), the controller ends the process as Xa=Xa0 in Step S20. Otherwise, the controller positions the X coordinate of the center of the reference hole 54 at the coordinate Xa of the work piece mounting position of this time as Xa=(X+k+Xd). Thereby, the printed circuit board 2 is mounted on the mounting surface 50s of the stationary table 50 always at least by 1 mm or more.

It is noted that if the distance from an end of the printed circuit board 2 (an end 2e in FIG. 17) to the reference pin 3b is constant for example, the length in the X-axis direction of the printed circuit board 2 (whole length) may be used instead of the length X.

The machining tables 50 and 51 composed of the stationary table 50 and movable table 51 described above may be constructed so as to be light in weight by using glass-fiber reinforced resin and the like. In particular, the movable table 51 may be lighten its weight structurally, so that it may be formed by using light metals such as aluminum or by iron and stainless steel so as to be tough against changes of ambient temperature in a factory for example.

It is noted that although the printed circuit board drilling apparatus has been explained as one example of the machining apparatus of the invention, the invention is not limited to that and may be applied to other machining apparatuses such as a milling machine, a grinding machine and the like.

Furthermore, the stationary table 50 is not always necessary to be a rectangle lengthy in the Y-axis direction and may be formed so as to be long both in the X-axis and Y-axis directions for example to support the whole surface of the printed circuit board 2 together with the movable table 51. Further, the movable table 51 is not always necessary to construct so as to cross with the stationary table 50 through the groove 50v and may be constructed so as to cross with the gate-like stationary table 50 when seen from the front side by passing through a part between the stationary table 50 and the bed 20.

What is claimed is:

1. A machining apparatus, comprising:
    machining tables having mounting surfaces for mounting a work piece; and
    a machining section for machining the work piece mounted on the mounting surfaces of the machining tables:
    said machining tables and machining section being relatively moved in plan view to determine machining position and to machine the work piece;
    wherein one of said machining tables is a stationary table located at position facing to said machining section, having a length at least longer than a moving distance of the machining section and fixed to a stationary member; and
    the other of said machining tables is a movable table supported by the stationary table movably in the direction perpendicular to the moving direction of said machining section and having the mounting surface whose width is narrower than the work piece to be mounted in the moving direction of said machining section; and
    wherein the work piece is fixed on the mounting surface of said movable table, moved by said movable table in the direction perpendicular to the moving direction of said machining section, and machined by said machining section at positions on the mounting surface of said stationary table where said machining section is relatively moved above.

2. The machining apparatus according to claim 1, wherein said stationary and movable tables are arranged so as to support part of the work piece by the mounting surfaces of the stationary and movable tables and to support the center of gravity of the work piece by the mounting surface of the movable table.

3. The machining apparatus according to claim 1, wherein said stationary table is formed into a rectangular shape that is long in the moving direction of said machining section in plan view and has a groove cut in the direction perpendicular to the longitudinal direction thereof on the mounting surface thereof;
   said movable table is slidably supported by the groove of said stationary table and is formed into a rectangular shape whose length in the direction along the groove is at least longer than the length of the groove;
   said machining tables are constructed by crossing these rectangular stationary and movable tables; and
   said machining tables do not support the whole area of the work piece and are arranged so as to machine the work piece on the mounting surface of said stationary table or on the mounting surface of said movable table at the crossing with the stationary table.

4. The machining apparatus according to claim 1, wherein a machining unit is composed of a plurality of machining sections disposed in parallel at predetermined regular intervals;
   one stationary table; and
   a plurality of movable tables provided in parallel at positions corresponding to the respective machining sections; and
   wherein the machining apparatus comprises at least one machining unit.

5. The machining apparatus according to claim 1, wherein the difference of level of the mounting surfaces of the stationary and movable tables is set within a range in which the work piece can be retained with its flexibility on the mounting surface of the stationary table when the machining section presses the work piece to the stationary table during machining.

6. The machining apparatus according to claim 5, wherein said movable table is arranged so that the level of the mounting surface of said movable table is higher than that of the mounting surface of said stationary table.

7. The machining apparatus according to claim 5, wherein said movable table is arranged so that the level of the mounting surface of the movable table is lower than that of the mounting surface of said stationary table.

8. The machining apparatus according to claim 1, wherein the work piece is a printed circuit board, and
   the difference in level between the mounting surface of said stationary table and the mounting surface of said movable table is within a range of ±0.1 mm.

9. The machining apparatus according to claim 1, wherein a frame member extending in the moving direction of the machining section is provided at one end of said movable table, a support for supporting the edge of the work piece is attached to the frame member; and a groove for preventing a collision with the support is formed on the stationary table at the position corresponding to the support.

10. The machining apparatus according to claim 9, wherein said frame member is arranged as a tool mounting section for mounting tools of the machining section.

11. The machining apparatus according to claim 1, wherein a wear-resistant treatment is implemented on the surface of said stationary table.

12. The machining apparatus according to claim 1, wherein said machining table is made of iron or light metal.

13. A machining method of the machining apparatus of claim 1, comprising steps of:
   mounting and fixing a work piece on the mounting surface of said movable table;
   moving the work piece by said movable table in the direction perpendicular to the moving direction of said machining section while relatively being moved to the mounting surface of said stationary table; and
   machining the work piece at position facing to said stationary table by said machining section being moved:
   wherein a moving range of said movable table during machining is set within a range in which part of the work piece always overlaps with the mounting surface of said stationary table.

* * * * *